(12) United States Patent
Oosterlaken (10) Patent No.: US 9,048,271 B2
(45) Date of Patent: Jun. 2, 2015

(54) MODULAR SEMICONDUCTOR PROCESSING SYSTEM

(75) Inventor: Theodorus G.M. Oosterlaken, Almere (NL)

(73) Assignee: ASM INTERNATIONAL N.V., Almere (NL)

( * ) Notice: Subject to any disclaimer, the term of this patent is extended or adjusted under 35 U.S.C. 154(b) by 807 days.

(21) Appl. No.: 13/248,468

(22) Filed: Sep. 29, 2011

(65) Prior Publication Data
US 2013/0085593 A1    Apr. 4, 2013

(51) Int. Cl.
| G06F 19/00 | (2011.01) |
| G05D 11/00 | (2006.01) |
| G05D 3/12 | (2006.01) |
| G05D 5/00 | (2006.01) |
| G05D 9/00 | (2006.01) |
| G05D 17/00 | (2006.01) |
| H01L 21/67 | (2006.01) |

(52) U.S. Cl.
CPC .... *H01L 21/67184* (2013.01); *H01L 21/67161* (2013.01)

(58) Field of Classification Search
CPC .................................................. H01L 21/67184
USPC ......................................... 700/112, 286–298
See application file for complete search history.

(56) References Cited

U.S. PATENT DOCUMENTS

| 4,824,209 A | 4/1989 | Bolton et al. |
| 4,824,309 A | 4/1989 | Kakehi et al. |
| 5,178,639 A | 1/1993 | Nishi |
| 5,387,265 A | 2/1995 | Kakizaki et al. |
| 5,407,449 A | 4/1995 | Zinger |
| 5,464,313 A | 11/1995 | Ohsawa |
| 5,820,366 A | 10/1998 | Lee |
| 6,176,667 B1 * | 1/2001 | Fairbairn et al. ............... 414/217 |
| 6,630,053 B2 * | 10/2003 | Yamagishi et al. ....... 156/345.32 |
| 6,663,332 B1 | 12/2003 | Sluijk et al. |
| 6,934,606 B1 * | 8/2005 | Genetti et al. ................. 700/254 |
| 2002/0036065 A1 * | 3/2002 | Yamagishi et al. ............ 156/345 |
| 2003/0053893 A1 * | 3/2003 | Matsunaga et al. ............ 414/217 |
| 2003/0155076 A1 * | 8/2003 | Murakami ................ 156/345.31 |
| 2007/0295274 A1 * | 12/2007 | Webb et al. .................... 118/719 |
| 2008/0056854 A1 * | 3/2008 | Yamagishi et al. ............ 414/217 |
| 2008/0075562 A1 * | 3/2008 | Maria De Ridder et al. . 414/217 |
| 2008/0210168 A1 | 9/2008 | Su et al. |
| 2009/0297299 A1 * | 12/2009 | Campbell et al. ........... 414/217.1 |

(Continued)

FOREIGN PATENT DOCUMENTS

| WO | WO 2007/010228 | 9/2007 |
| WO | WO 2007/150009 | 12/2007 |

*Primary Examiner* — Mohammad Ali
*Assistant Examiner* — Ziaul Karim
(74) *Attorney, Agent, or Firm* — Preti Flaherty Beliveau & Pachios LLP (57) ABSTRACT

Disclosed is a modular semiconductor substrate processing system (1), including a plurality of independently operable substrate processing units (100). Each unit (100) comprises a reactor module (104) and a substrate transfer module (102). Within the system (1), the substrate transfer modules (102) of the different units (100) are serially interconnected such that substrates (116) may be exchanged between them. Exchange of substrates (116) between neighboring processing units (100) is facilitated by a shared substrate hand-off station (130) that is associated with each pair of neighboring processing units. The actual transfer of substrates is performed by a substrate handling robot (122), which may preferably be of the SCARA-type.

20 Claims, 3 Drawing Sheets

(56) References Cited

U.S. PATENT DOCUMENTS

| | | |
|---|---|---|
| 2010/0068414 A1 | 3/2010 | Takahashi et al. |
| 2011/0014562 A1 | 1/2011 | Matsuoka et al. |
| 2011/0041764 A1* | 2/2011 | Webb et al. .................. 118/715 |
| 2011/0078898 A1 | 4/2011 | Ishida et al. |

* cited by examiner

MODULAR SEMICONDUCTOR PROCESSING SYSTEM

FIELD OF THE INVENTION

The present invention relates to the field of semiconductor processing, and more in particular to a modular semiconductor processing system in which a plurality of independently operable, mutually couplable processing units are integrated to form one tool within which substrates may be selectively transferred from one processing unit to another in an automated fashion.

BACKGROUND

Semiconductor processing apparatus such as, for example, vertical batch furnaces, are known in the art. A single semiconductor processing apparatus may normally be configured to perform one specific treatment step, e.g. oxidation, annealing or chemical vapor deposition, on a single flat substrate or a batch of flat substrates. Since various consecutive treatments may be required to fully process a single substrate, a semiconductor fabrication facility may have multiple semiconductor processing apparatus, each of which may be configured to perform one of the desired treatment steps. Substrates may be transferred between the different semiconductor processing apparatus in a substrate cassette or pod, which may hold a plurality of substrates in a protective, possibly sealed environment. Pods are standardized and therefore attachable to tools from different vendors. Although transporting substrates between tools by means of pods is a tried method, the routine is relatively slow and labor-intensive. Furthermore, for some series of treatments it would be beneficial if substrates could be transferred from one tool to another without breaking or changing the protective ambient around them.

Inter alia to reduce the labor-intensive use of pods, to increase the overall substrate throughput and to improve the quality of composite treatments, attempts have been made to design scalable tools, i.e. tools in which a number of different processing units may be combined, and in which the number and type of the processing units may be changed freely to accommodate to a change in the series of treatments that define the overall fabrication process. Many such attempts, however, have required major concessions in the design of the individual processing units, impairing their competitiveness as stand-alone units or their ability to operate independently. Other attempts have resulted in overly complex and therefore relatively expensive and unreliable designs. An example of a modular semiconductor processing apparatus of the latter type is disclosed by U.S. Pat. No. 4,824,309 (Kakehi et al.).

SUMMARY OF THE INVENTION

It is an object of the present invention to provide for a modular semiconductor substrate processing system comprising a plurality of processing units, each of which can either be operated independently as a stand-alone system, or be joined to any number of processing units so as to allow substrates presented to one processing unit to be internally transferred between and selectively processed by one or more other processing units in an automated fashion.

It is a further object of the present invention to provide for a modular semiconductor substrate processing system in which the parts that interface between coupled processing units are structurally simple and reliable.

To these ends, a first aspect of the present invention is directed to a modular semiconductor substrate processing system, comprising a plurality of independently operable substrate processing units. Each processing unit comprises a reactor module at a rear side of the unit, including at least one reactor for processing at least one substrate. Each processing unit further comprises a substrate transfer module at a front side of the unit. A substrate transfer module includes a substrate transfer chamber, defined by at least a front wall and two side walls; a substrate cassette I/O-port provided in the front wall of the substrate transfer chamber for receiving at least one substrate cassette; a substrate handling robot disposed within the substrate transfer chamber and capable of transferring substrates between a substrate cassette received at the I/O-port and the reactor module; and a coupling provision provided at at least one of the side walls of the substrate transfer chamber, and configured for cooperation with a coupling provision of another processing unit so as to interconnect the respective processing units and to define an optionally closable substrate transfer passage between their substrate transfer chambers. Within the system, the processing units are serially interconnected via said coupling provisions. The system also comprises at least one substrate hand-off station that is configured to temporarily hold at least one substrate. At least one substrate hand-off station is associated with a pair, and preferable each pair, of neighboring, interconnected processing units and at least partially disposed within one of the substrate transfer chambers of said respective pair of neighboring processing units and/or the substrate transfer passage between them. The substrate handling robots of said pair(s) of neighboring processing units are configured to access their associated substrate hand-off station (i.e. the hand-off station associated with said pair) so as to exchange substrates via said substrate hand-off station.

A second aspect of the present invention is directed to an independently operable semiconductor substrate processing unit configured to be integratable into a modular semiconductor processing system according to the first aspect of the present invention. The processing unit comprises a reactor module at a rear side of the unit, including at least one reactor for processing at least one substrate. The processing unit further comprises a substrate transfer module at a front side of the unit. The substrate transfer module includes a substrate transfer chamber, defined by at least a front wall and two side walls; a substrate cassette I/O-port provided in the front wall of the substrate transfer chamber for receiving at least one substrate cassette; a substrate handling robot disposed within the substrate transfer chamber and capable of transferring substrates between a substrate cassette received at the I/O-port and the reactor module; and a coupling provision provided at at least one of the side walls of the substrate transfer chamber, and configured for cooperation with a coupling provision of another processing unit so as to interconnect the respective processing units and to define an optionally closable substrate transfer passage between their substrate transfer chambers. The substrate transfer module also includes at least one substrate hand-off station that is disposed in the substrate transfer chamber, laterally between the substrate handling robot and a side wall comprising a said coupling provision, and that is configured to temporarily hold at least one substrate.

A third aspect of the present invention is directed to a method of operating a modular semiconductor processing system. The method comprises providing a modular semiconductor processing system according to the first aspect of the invention. It further includes docking a substrate cassette holding at least one substrate to a substrate cassette I/O-port of a processing unit of the system, and transferring said at least one substrate along a process route that extends successively from said docked substrate cassette to a reactor of a first processing unit, from said reactor of the first processing unit to a hand-off station, and from said hand-off station to a reactor of a second processing unit.

These and other features and advantages of the invention will be more fully understood from the following detailed description of certain embodiments of the invention, taken together with the accompanying drawings, which are meant to illustrate and not to limit the invention.

DETAILED DESCRIPTION

Figure 1:
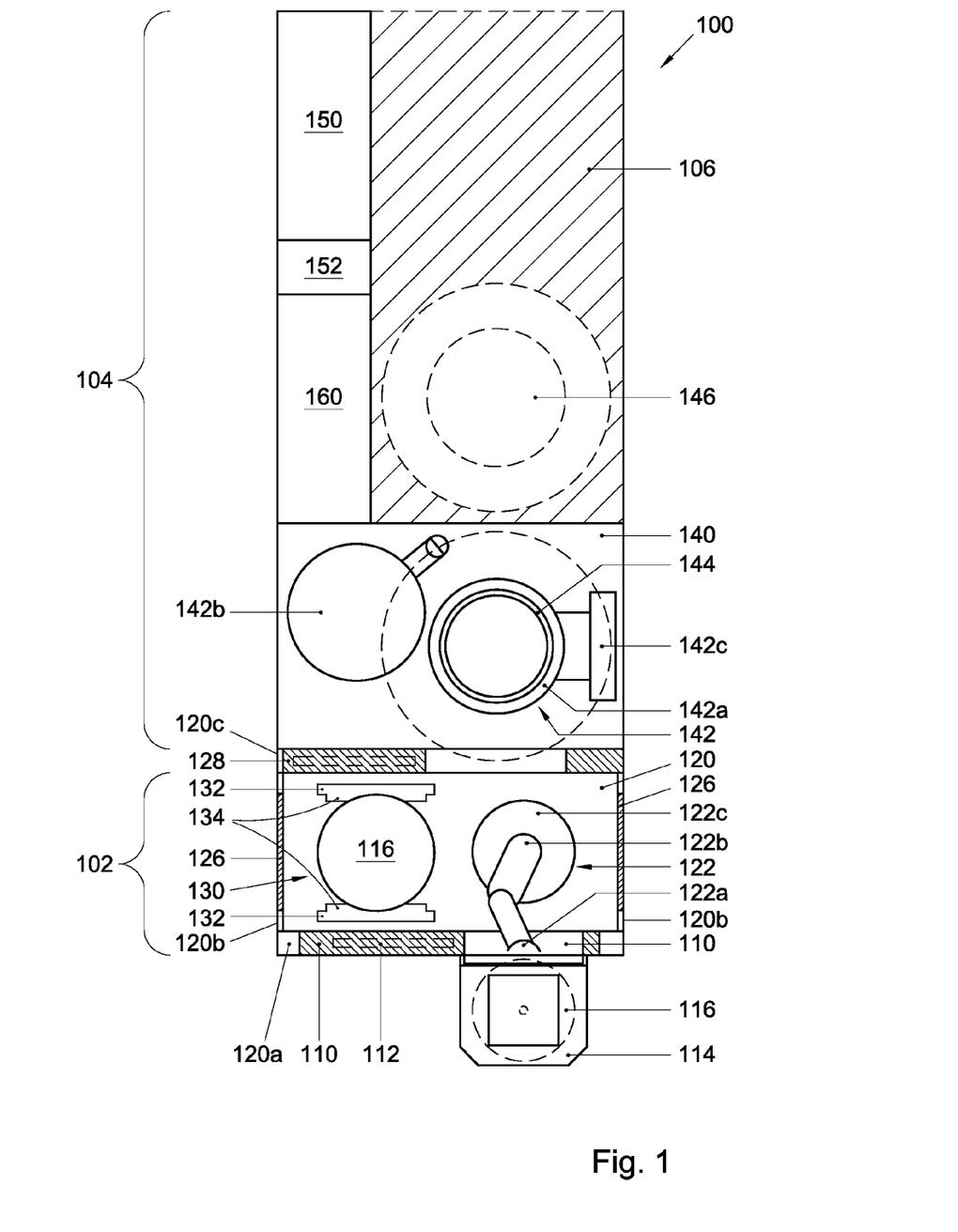
FIG. 1 is a schematic plan view of a single, exemplary semiconductor processing unit according to the present invention.
Figure 2:
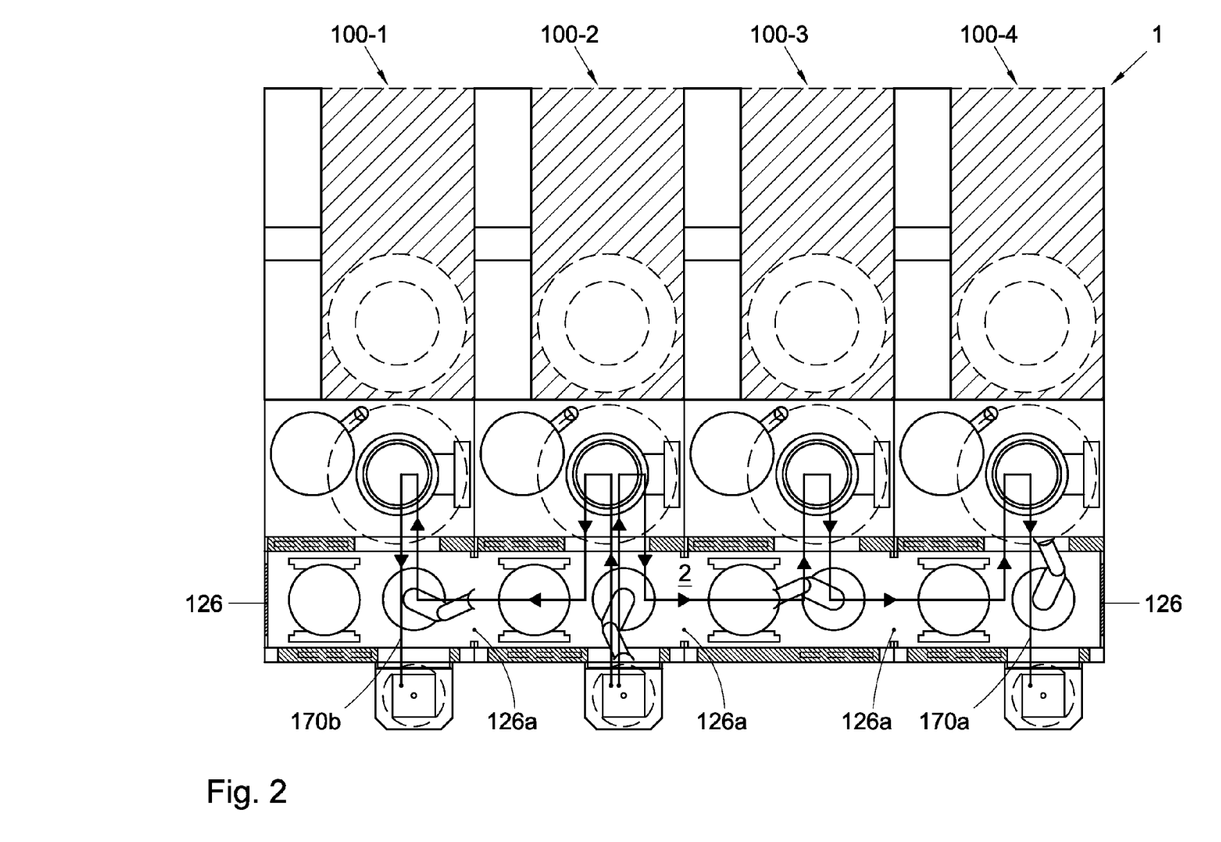
FIG. 2 is a schematic plan view of an exemplary modular semiconductor processing system according to the present invention, including four processing units as shown in FIG. 1.

FIG. 1 is a schematic plan view of a single semiconductor processing unit 100 according to the present invention. The depicted processing unit 100 is a vertical batch furnace, and is shown in isolation as a stand-alone tool. FIG. 2 is a schematic plan view of an exemplary modular semiconductor processing system 1 according to the present invention, comprising four processing units 100 of the type shown in FIG. 1. The construction and operation of a single processing unit 100 will first be elucidated briefly in general terms with reference to FIG. 1. Then the integration of multiple processing units 100 into a system 1 will be discussed with reference to FIG. 2.

The semiconductor processing unit 100 includes a substrate transfer module 102, and a reactor module 104 that forms the parent tool to which the substrate transfer module 102 has been added. The substrate transfer module 102 may be regarded as the interface via which substrates 116, e.g. silicon wafers, may be moved between ultra-clean pods or substrate cassettes 114 that may be docked to a front side of the substrate transfer module, and the reactor 142 in the reactor module 104 provided at the back of the substrate transfer module.

A typical substrate transfer module 102 may include at least one substrate cassette input/output (I/O-) port 110 to which substrate cassettes or pods 114 may be detachably docked. In case a substrate transfer module is fitted with multiple I/O-ports 110, the ports may be arranged in a vertically stacked fashion, i.e. one I/O-port placed above another, or be horizontally juxtaposed, i.e. one I/O-port placed next to another. The depicted exemplary processing unit 100 is configured to handle 300 mm silicon wafers, which may be transported using so-called front opening unified pods (FOUP). A FOUP 114 forms a closed carrier box for a plurality of substrates 116 within the semiconductor fabrication facility. Its main purpose is to isolate the substrates 116 from the clean room environment in which the processing unit 100 as a whole is provided. To end, a special micro-climate is generated and maintained within the FOUP 114, which micro-climate may have a clean room class that is lower (lower means cleaner) than that of the general clean room environment of the semiconductor fabrication facility. The use of FOUPs 114 may thus save investments needed for high-grade clean rooms. To receive a FOUP 114, the processing unit 100 of FIG. 1 is fitted with two I/O-ports 110, which are arranged in a vertically stacked fashion at the front side of the substrate transfer module 102. A FOUP 114 may be docked to the substrate transfer module 102 by attaching it to one of the I/O-ports 110 thereof. This allows a horizontally moving door 112 of the respective I/O-port 120 to be opened to bring the micro-climate inside the FOUP 114 in fluid communication with the atmosphere in a substrate transfer chamber 120 of the substrate transfer module 102, and to enable access to the substrates 116 inside the FOUP.

The substrate transfer chamber 120 of the substrate transfer module 102 may be regarded as a work cell, defined by a plurality of bounding walls, including a front wall 120a, two opposite lateral side walls 120b and a back wall 120c, all of which may include provisions 110, 126 for the passage of substrates. As already illustrated with respect to the I/O-port 110 in the front wall 120a, such a provision may typically include some kind of (preferably fluid tight) gate that defines a substrate transfer passage, which passage may be opened and or closed by associated gate opening- and closing means. The substrate transfer chamber 120 may hold a protective, conditioned atmosphere, e.g. an air atmosphere or a nitrogen atmosphere, in which oxygen levels, humidity, temperature and/or particle contamination are monitored and controlled within specified parameters. The atmosphere of the substrate transfer chamber 120 may preferably be held at a substantially atmospheric pressure. Within that atmosphere, the substrate transfer chamber may accommodate a substrate handling robot 122 and a substrate hand-off station 130.

The substrate handling robot 122 may be of a conventional design, and for example be of the SCARA (Selectively Compliant Articulated Robot Arm) or frog-leg type. In general, the substrate handling robot 122 may include an end-effector 122a, e.g. a mechanical or negative pressure type end-effector for one or more substrates, that is provided at an extremity of an articulated arm 122b comprising a number of links that are interconnected via optionally parallel, drivable axes. The arm may itself be rotatably mounted on a backbone or base 122c that includes a lift mechanism to enable the arm 122b to both rotate around and travel along the vertical axis. Accordingly, the substrate handling robot 122 may have a 270°, and preferably 360° motion range (around the vertical axis) across which it can radially extend and retract at varying heights to pick up and deliver substrates 116, in particular from and to a docked pod 114, a substrate hand-off station 130, and a wafer boat 144 of the reactor 142 to be described infra.

The substrate hand-off station 130 is a depository configured to temporarily hold at least one, and preferably a plurality of substrates. It may be formed by a passive rack that defines a plurality of spaced apart substrate holding positions. Each of the substrate holding positions may be accessible from substantially opposites sides, so as to enable insertion of a substrate into a substrate holding position from one side, and removal of the substrate from the substrate holding position from the opposite side, and vice versa, in a manner reminiscent of a serving-hatch. The rack may preferably be configured to hold multiple horizontally orientated substrates in a vertically spaced apart relationship. It is contemplated, however, that other substrate orientations and spacing relations may be used as well, although they are likely to be less space-efficient.

From a structural point of view, the substrate hand-off station 130 may be similar to the substrate holding structure in a conventional pod 114, albeit that such a structure may normally not facilitate insertion and removal of substrates from opposite sides. In the depicted embodiment, the passive rack of the substrate hand-off station 130 includes two substantially vertically extending plate members 132 which, at regularly spaced apart positions along their height, are provided with substrate supports 134. The substrate supports 134 may be elongate, substantially horizontally extending ridges that protrude from the plate members 132. Substrate supports 134 at opposing sides of the two members 132 that are placed at a same height may define a substrate holding position. A substrate 116 may be stored in a substrate holding position in a substantially horizontal orientation by supporting it on upper surfaces of its protruding substrate supports 134, as shown. It will be appreciated that the placement of the supports 134 at the front and rear sides of the substrate hand-off station 130 facilitates placement and removal of a substrate 116 thereon and therefrom, respectively, by substrate handling robots 122 at opposite lateral sides of the hand-off station 130.

Each of the lateral sides 120b of the housing of the substrate transfer module 102 may further include a coupling provision 126. A coupling provision 126 may be configured for cooperation with a similar or complementary coupling provision on another processing unit, so as to enable the interconnection of the respective processing units, and to thereby define an optionally closable substrate transfer passage between their substrate transfer chambers 120. In the depicted embodiment of the processing unit 100, each of the lateral sides 120b includes a coupling provision in the form of a gate 126 that is switchable between an open and a closed state. In its open state, a gate 126 may allow for the exchange of substrates through the gate via a substrate transfer passage 126a (see FIG. 2), while in the closed state, the gate may sealingly close off and bound the substrate transfer chamber 120, preferably in a fluid tight manner. When the processing unit 100 is set up for stand-alone use, as in FIG. 1, the gates 126 may be closed. However, when the processing unit 100 is integrated into a modular system 1 including further processing units 100, as shown in FIG. 2, a gate 126 of a first processing unit and a facing gate 126 of another, juxtaposed processing unit 100 may be opened. The opened gates 126 may be interconnected to define a (common) substrate transfer passage 126a that extends between the substrate transfer chamber 120 of the first processing unit and the substrate transfer chamber 120 of the second processing unit.

One skilled in the art will appreciate that the coupling provisions 126 on the same processing unit 100, or on different processing units 100 may be structurally different. In one embodiment of the system, for example, all processing units may have identical coupling provisions at both lateral sides, wherein each coupling provision is capable of being coupled to a coupling provision of its own kind (homogenous coupling). In another embodiment, all processing units may have a first type of coupling provision at one lateral side, and a second type of coupling provision on the opposite lateral side, wherein the coupling provision of the first type is configured for cooperation with a coupling of the second type (heterogeneous coupling). In yet another embodiment, the processing units need not all be mutually exchangeable. That is, some processing units may, by means of the choice of their coupling provisions, be configured to be able to couple only with selected processing units, and not with others.

In one embodiment, the substrate transfer module 102 of a processing unit 100 may be a commercially available equipment front end module (EFEM) to which the features of the invention are added, in particular a substrate hand-off station 130, and one or more coupling provisions 126 for bringing the EFEM in communication with a neighboring EFEM so as to facilitate the transfer of substrates between them. A typical EFEM may already comprise a programmable substrate handling robot 122 that is suitable for the purpose of transferring substrates 116 between juxtaposed EFEMs. Accordingly, existing EFEM-including processing units 100 may be retrofitted fitted with some relatively inexpensive components to enable them to be used in a modular system 1 according to the present invention.

At the back of the substrate transfer module 102, the processing unit 100 includes the reactor module 104. In the exemplary processing unit 100 of FIG. 1, a first section of the reactor module 104, located adjacent the back wall 120c of the substrate transfer module 102, includes a reactor cabinet 140 that accommodates a single vertical batch reactor 142 for simultaneously processing a plurality of substrates, in the form of a thermal furnace. The thermal furnace 142 may define a heatable bell shaped reaction tube 142a, a lower end of which may be open so as to allow a wafer boat 144 to be introduced therein from below. To lift the wafer boat 144 into the reaction tube 142a before processing, and to lower the wafer boat from the reaction tube after processing, the reactor 142 may include a lift mechanism 142c. A door plate, supporting the wafer boat, may seal the reaction tube 142a during processing. In addition, a horizontally moveable, motor driven shutter plate 142b may be provided to close the opening of the reaction tube 142a during the time the wafer boat is removed from the reaction tube and to limit the heat radiation emanating from the reaction tube.

Further to the back, the reactor module 104 may define a power cabinet 150, a control unit 152, and a gas cabinet 160. The power cabinet 150 may accommodate all primary electrical components of the processing unit 100, and distribute electrical facilities to the gas cabinet 160, the control unit 152, the reactor 142 and the substrate transfer module 102, in particular to the substrate handling robot 122 thereof. The gas cabinet 160 may accommodate all process gas facilities, including for example pressure gauges, flow controllers, valves, a process gas controller, and peripheral equipment. The control unit 152 may include a programmable CPU, and be operably connected to all controllable electrical components and process gas facilities of the processing unit 100, including in particular the reactor 142 and the substrate handling robot 122, so as to be able to control the operation of the unit and its parts in accordance with the program it is configured to execute.

The entire processing unit 100, and more specifically the reactor module 104, including the reactor cabinet 140 and the power and gas cabinets 150, 160, may have any shape needed to accommodate all the components, e.g. rectangular, polygonal etc. However, the reactor module 104 may preferably have a generally L-shaped footprint. Such a footprint may facilitate maintenance and reconfiguration of a processing unit 100 that is used in juxtaposition with other processing units 100 (cf. FIG. 2), as it may facilitate access to the power and gas cabinets 150, 160, and to the reactor 142 in the reactor cabinet 140. In a particularly advantageous embodiment, a reactor 142 may be movably mounted in the reactor cabinet, e.g. be suspended from a top wall of the reactor cabinet 140 by means of a carriage that runs on a rail, and so as to allow the reactor 142 to be moved out of the reactor cabinet 140, into a maintenance position 146 in the indentation of the L-shaped footprint.

The processing unit 100 may operate in a stand-alone fashion as follows. One or two pods 114 may be manually docked to the respective I/O-ports 110 of the substrate transfer module 102, which may cause the control unit 152 to initiate a sequence of actions. The control unit 152 may, for example, instruct the substrate handling robot 122 to pick up the substrates 116 from the pods 114, and to place them in the wafer boat 144 of the reactor 142 disposed in the reactor cabinet 140. Once the wafer boat 144 is fully loaded, the control unit 152 may control the shutter 142b to move into a position in which the reaction tube 142a is open and activate the lift mechanism 142c to lift the wafer boat 144 into the reaction tube 142a. Then the control unit 152 may coordinate the treatment of the substrates 116 in the reactor 142. When the processing of the substrates 116 is completed, the above actions may be executed in reverse order to again collect the substrates in the pods 114. A pod transfer system may then remove the pods 114 from the I/O-ports 110 of the substrate transfer module 102, and transfer them to another processing unit in the semiconductor fabrication facility for further treatment.

Now that the construction and operation of a single processing unit 100 has been elucidated in some detail, attention is invited to the manner in which a plurality of such units 100 may be integrated into a modular processing system.

FIG. 2 schematically illustrates a plan view of an exemplary modular semiconductor processing system 1 including four processing units 100-1, 100-2, 100-3, 100-4, each of which may be structurally identical to the one discussed above with reference to FIG. 1. Despite their structural similarity, the processing units 100-1, 100-2, 100-3, 100-4 may be configured to perform individually selected treatments. That is, depending on, for instance, the desired composition of a sequence of processing treatments and the duration of these individual treatments, the processing units 100-1, 100-2, 100-3, 100-4 may be configured to perform mutually different treatments that, when executed in the right order, together account for the overall desired sequence.

The processing units 100-1, 100-2, 100-3, 100-4 of the system 1 are arranged in juxtaposition. With their substrate transfer modules 102 in alignment, the lateral gates 126 in between any two adjacent processing units 100-1, 100-2, 100-3, 100-4 have been opened and connected, preferably in a fluid tight manner. The thus serially interconnected substrate transfer chambers 120 now define a common substrate transfer chamber 2 with a shared interior atmosphere. It is noted that although the gates 126 in the embodiment of FIG. 2 are permanently open, this need not be the case in alternative embodiments. In one such an alternative embodiment, for example, the gates 126 between any two neighboring substrate transfer chambers 120 may be normally closed, and opened only selectively when there is an actual, immediate need for the exchange of a substrate between two adjacent substrate transfer chambers 120.

In addition, the control units 152 of the processing units 100-1, 100-2, 100-3, 100-4 may have been coupled or their operations may have been geared towards one another, such that the processing units may operate as an integrated whole. In one embodiment, one of the control units 152 of the processing units 100-1, 100-2, 100-3, 100-4, may be designated as a master control unit that serves to coordinate the operation of all coupled processing units, either directly or through the intermediation of the other control units 152 which to this end may be designated as slaves. The master control unit 152 may in particular keep track of the flow and actual positions of individual substrates 116 through the system, vacant substrate holding positions in pods 114 and substrate hand-off stations 130 and the state of the gates 126, and coordinate the processing of the substrates 116 by the various reactors 142 and their transport between them. In an alternative embodiment, the aforementioned tasks of a master control unit may be performed by an additional, external master control unit (not shown).

Instead of assigning one control unit 152 the status of master control unit, it is contemplated that the control units of the different processing units 100-1, 100-2, 1003, 100-4 may alternatively be configured to operate independently, merely instructed of the fact that they are coupled to other processing units from which they may receive or to which they may output substrates. The control unit 152 of a respective processing unit 100-1, 100-2, 100-3, 100-4 may for example be provided with instructions to pick up substrates from a first location, e.g. the substrate cassette I/O-port 110 of the respective processing unit or its substrate hand-off station 130, and to deliver them to a second location, e.g. the substrate cassette I/O-port of the respective processing unit or the substrate hand-off station 130 of a neighboring processing unit, possibly by intermediately delivering a substrate to and picking the substrate up from a third station, e.g. the reactor 142 of the respective processing unit.

To illustrate how the interconnected process units 100-1, 100-2, 100-3 and 100-4 may cooperate, the plan view of FIG. 2 schematically depicts two different process routes 170a, 170b. A process route is a path through the system 1 to be followed by a substrate 116, extending from a first substrate cassette I/O-port 110, via one or more reactors 142, back to the same or another substrate cassette I/O-port 110 of the system 1. The control units 152 of the system may assign a process route to each individual substrate entering the system 1, and control in particular the substrate handling robots 122 thereof to quickly and reliably execute that process route.

Process route 170a successively extends from the substrate cassette I/O-port 110 of processing unit 100-2, to the reactor 142 of processing unit 100-2, the reactor of the processing unit 100-3, the reactor of processing unit 100-4 and the substrate cassette I/O-port 110 of processing unit 100-4. In executing this process route 170a, the substrate handling robot 122 of the processing unit 100-2 may first unload a substrate 116 from a substrate cassette 114 docked to the substrate cassette I/O-port of that unit, and transfer the substrate to the wafer boat 144 of reactor 142 thereof. Once treatment by this reactor 142 has been completed, the substrate handling robot 122 of processing unit 100-2 may unload the substrate from the wafer boat 144 of processing unit 100-2, and transfer it to the substrate hand-off station 130 of neighboring processing unit 100-3. Since the gates 126 of the juxtaposed processing units 100-2 and 100-3 have been aligned, opened and connected, there is no barrier for such transfer: the wafer handling robot 122 of processing unit 100-2 may simply reach through the substrate transfer passages 126a that now connects the substrate transfer chambers 120 of processing units 100-2 and 100-3, and place the substrate in a vacant substrate holding position of the substrate hand-off station 130 of processing unit 100-3. The substrate handling robot 122 of processing unit 100-3 may then pick up the substrate 116 from the substrate hand-off station 130 of processing unit 100-3, and pass it on to the wafer boat 144 of the reactor 142 of processing unit 100-3. Once treatment of the substrate 116 by the reactor of processing unit 100-3 is completed, the substrate 116 may similarly be passed on to the wafer hand-off station of processing unit 100-4, the reactor 142 of processing unit 100-4 and the substrate cassette 114 docked to the substrate cassette I/O-port 110 of processing unit 100-4.

FIG. 2 depicts two different exemplary process routes 170a, 170b to indicate that substrates 116 from a same substrate cassette 114, here the substrate cassette 114 docked to the substrate cassette I/O-port of processing unit 100-2, need not necessarily follow the same path through the system. Each substrate 116 may be assigned its own process route, and thus be treated according to specific, individual instructions. Accordingly, the output of the reactor 142 of processing unit 100-2 may be split up between the two neighboring processing units 100-1 and 100-3. This may, for example, be advantageous when the effective throughput (substrates per unit of time) and/or substrate capacity (i.e. the number of simultaneously treatable substrates) of a processing unit configured to run a first treatment process is much higher that of a processing unit configured to run a second, consecutive treatment process. In the case of the embodiment of FIG. 2, processing unit 100-2 may be configured to run the first treatment process, and the substrate output flow from processing unit 100-2 may be divided between the neighboring processing units 100-1 and 100-3, which may be identically configured to run a same second treatment process. In other embodiments, the combined output of two processing units may be routed to their common neighbor on account of similar but opposite considerations.

It will be clear that the modular semiconductor processing system 1 of FIG. 2 may be reconfigured easily, and is highly scalable. For example, to accommodate to a change in the fabrication/treatment process of one or more substrates, it may be sufficient to change the process route that is assigned to these substrates, at least if the desired treatments can all be provided for by the processing units 100 present in the system 1. Alternatively, one or more semiconductor processing units 100 may be reconfigured to be able to perform the desired treatments, preferably along a logistically economical process route, e.g. by connecting them to/providing them with different process gas supplies. Such reconfiguration is facilitated by the L-shaped footprint of the reactor modules 104 of the processing units 100, which provides workers with access to the power cabinets 150, the control units 152, and the gas cabinets 160 of juxtaposed units. In case the fabrication process is to be extended with one or more treatments, the system 1 may accordingly be extended with one or more processing units 100 configured to perform these treatments. The number of processing units in the system may be changed freely. An extension may be effected simply by connecting a new processing unit 100 to a terminal processing unit 100-1, 100-4 of the system 1, or inserting it between two already serially connected processing units thereof, while a reduction may be effected by the opposite action. Any processing units 100 that are removed from system 1 may be used in a stand-alone configuration, or as part of another system 1.

Where a semiconductor fabrication facility employs one or more modular systems 1, possibly in combination with one or more stand alone processing units 100, to perform a complete series of treatments, pods 114 may have to be exchanged between the systems 1 and, optionally, the stand alone processing units 100. Such transport of pods 114 around a semiconductor fabrication facility, and the docking and undocking of a pod 114 to and from the I/O-port 110 of a substrate transfer module 102 of a processing unit 100 may in principle be performed manually by a worker. Due to the relatively large weight of a loaded pod 114, however, this mode of operation is generally not recommended. By way of alternative, some technical facilities to perform the transport, docking and undocking of a pod 114 to and from a substrate transfer module 102 will be discussed below.

In one embodiment of a modular semiconductor processing system 1, a pod 114 may be transported to and from, and be docked to and undocked from the I/O-port 110 of a substrate transfer module 102 by means of a conventional pod transport system, configured to transport pods 114 from one modular processing system 1 or processing unit 100 to another. Such a pod transport system may for example include an overhead rail system, or an automated guided vehicle.

In an alternative embodiment the modular semiconductor processing system 1 may be provided with a stocker system for pods. A stocker system may in particular be convenient if a batch of substrates to be processed by a certain processing unit comprises substrates from multiple pods, and loading of the batch requires the exchange of pods at the I/O-port(s) of the processing unit. In the exemplary embodiment of FIG. 3, two processing units 100-1, 100-2 have been interconnected to form a modular system 1, and processing unit 100-1 has been provided with a stocker system 170 for pods 114. The stocker system 170, may be positioned in front of a substrate transfer module 102 of processing unit 100-1, and comprise at least one stocker I/O-port 172 for receiving and outputting pods 114 from and to the outside world. To this end, the stocker I/O port 172 may be configured to interface with an automated overhead rail system 178 that supplies pods 114 to and discharges pods 114 from the stocker I/O port 172, and that effectively provides for the transport of pods 114 between different processing systems 1, 1'. The stocker system 174 may also define a number of stocking accommodations 174, for example provided by a case or one or more shelves, for storing pods 114. In the depicted embodiment, the stocker system 170 includes two stocking accommodations 174, each in the form of a series of vertically spaced apart shelves on which a pod 114 may be supported. The stocker system 170 may further include a pod transfer robot 176 that is configured to transfer pods 114 between the stocker I/O-port 172, the pod stocking accommodations 174 and the I/O-port(s) 110 of the substrate transfer module 102 of the processing unit 100-1 to which it has been added. In one embodiment, the pod transfer robot 176 may include two vertical guide members 176a in which a horizontally oriented guide rail 176b may be motorically drivable, up and down. A pod manipulator 176c, which may be movably mounted onto the guide rail 176, may be capable of picking up the pods 114 and moving them forwards and backwards across the horizontal guide rail 176b, and laterally along it.

Although illustrative embodiments of the present invention have been described above, in part with reference to the accompanying drawings, it is to be understood that the invention is not limited to these embodiments. Variations to the disclosed embodiments can be understood and effected by those skilled in the art in practicing the claimed invention, from a study of the drawings, the disclosure, and the appended claims.

Figure 3:
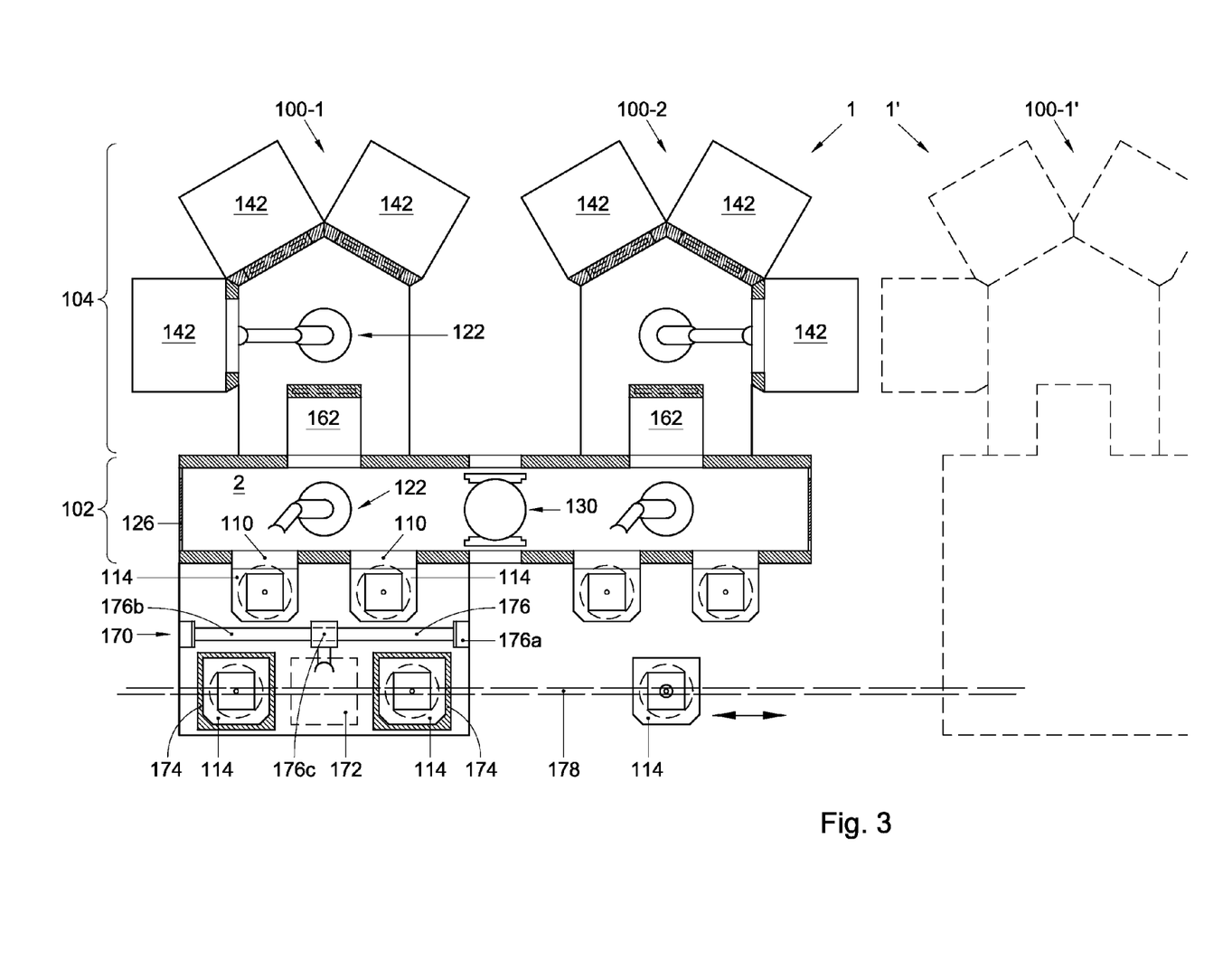
FIG. 3 is a schematic plan view of a second exemplary modular semiconductor processing system according to the present invention, including two interconnected processing systems, each including a cluster tool, wherein one of the processing systems is provided with a stocker system for pods.

For example, in the embodiments illustrated in FIGS. 1 and 2, the reactor modules 104 of the processing units 100 comprise one vertical batch furnace 142 for processing multiple substrates simultaneously. In other embodiments, however, the reactor module 104 of a processing unit 100 may comprise a single-wafer-reactor configured for processing one substrate at a time. In such embodiments, a substrate handling robot 122 may not place a substrate 116 in a wafer boat 144 that needs to be elevated into the reactor's reaction tube 142a, but instead directly in the single-wafer-reactor. Furthermore, as illustrated by FIG. 3, a processing unit 100 may provide for a reactor module 104 that accommodates more than one reactor 142, possibly in the form of a cluster tool including multiple reactors 142 and, optionally, a dedicated substrate distribution system such as, for example, a substrate handling robot 122 with an articulated arm configured to transfer substrates between the different reactors 142 of the cluster tool. In such an embodiment, a substrate handling robot 122 in the substrate transfer chamber 120 of the substrate transfer module 102 may place a substrate 116 at a transfer position 162 of the reactor module 104, e.g. a load lock chamber, from which the substrate is further transferred to a reactor 142 and vice versa by the dedicated substrate distribution system, which may be operating at vacuum conditions.

In the above, the invention is illustrated with reference to a system for processing of 300 mm wafers. One skilled in the art will appreciate, however, that the invention is equally well applicable to systems for the processing of substrates of different sizes and dimensions, e.g. 200 mm or 450 mm diameter circular substrates, or substrates having a rectangular or other flat shape. It is also noted that the disclosed system 1 may not be limited to the processing of silicon substrates; in principle, substrates of any suitable material, e.g. glass, sapphire, silicon carbide, or compound semiconductor materials, mar be processed.

Reference throughout this specification to "one embodiment" or "an embodiment" means that a particular feature, structure or characteristic described in connection with the embodiment is included in at least one embodiment of the present invention. Thus, the appearances of the phrases "in one embodiment" or in "an embodiment" in various places throughout this specification are not necessarily all referring to the same embodiment. Furthermore, it is noted that particular features, structures, or characteristics of one or more embodiments may be combined in any suitable manner to form new, not explicitly described embodiments.

LIST OF ELEMENTS 1 modular semiconductor processing system
2 common substrate transfer chamber
100 processing unit
102 equipment front end module (EFEM)
104 reactor module
106 maintenance space
110 substrate cassette I/O-port
112 I/O-port door
114 pod or substrate cassette
116 substrate
120 substrate transfer chamber
120a front wall of substrate transfer chamber
120b side wall of substrate transfer chamber
120c back wall of substrate transfer chamber
122 substrate handling robot
122a end-effector
122b articulated arm
122c backbone of substrate handling robot
126 side gate
126a substrate transfer passage
130 substrate hand-off station
132 vertically extending member
134 substrate support
140 reactor cabinet
142 reactor
142a reaction tube
142b horizontally moveable shutter for reaction tube
142c wafer boat lift
144 wafer boat
146 reactor position when moved into maintenance space
150 power cabinet
152 master control unit
160 gas cabinet
162 substrate transfer position/load lock chamber
170 stocker system for pods
172 stocker I/O port
174 pod accommodation
176 pod transfer robot
176a vertical guide member
176b horizontally oriented guide rail
176c pod manipulator
178 overhead rail system for transport of pods

We claim:

1. A modular semiconductor substrate processing system, including:
a plurality of independently operable substrate processing units, each unit including:
a reactor module at a rear side of the unit, including a reactor for processing at least one substrate; and
a substrate transfer module at a front side of the unit, including:
a substrate transfer chamber, defined by at least a front wall and two side walls;
a substrate cassette input/output (I/O)-port provided in the front wall of the substrate transfer chamber for receiving at least one substrate cassette;
a substrate handling robot disposed within the substrate transfer chamber and capable of transferring substrates between a substrate cassette received at the I/O-port and the reactor module; and
at least one coupling provision provided at one or more of the side walls of the substrate transfer chamber, and configured for cooperation with a coupling provision provided in a side wall of another processing unit so as to interconnect the respective processing units to define an optionally closable substrate transfer passage between their substrate transfer chambers;
wherein the processing units are serially interconnected via said coupling provisions;
at least one substrate hand-off station configured to temporarily hold at least one substrate, wherein at least one substrate hand-off station is associated with a pair of neighboring, interconnected processing units and at least partially disposed within one of the substrate transfer chambers of said respective pair of neighboring processing units and/or the substrate transfer passage between them;
wherein the substrate handling robots of said pair of neighboring processing units are configured to access their associated substrate hand-off station so as to exchange substrates via said substrate hand-off station from a substrate handling robot disposed in one of the two neighboring processing units to a substrate handling robot disposed in the other of the two neighboring processing units.

2. The system according to claim 1, wherein at least one substrate handling robot includes an articulated arm an extremity of which is provided with an end-effector, said robot being capable of picking up and delivering substrates from and to, respectively, all of: a substrate cassette docked to the I/O-port, the substrate hand-off station and the reactor module.

3. The system according to claim 2, wherein the at least one substrate handling robot is of a selectively compliant articulated robot arm (SCARA)-type.

4. The system according to claim 1, wherein the substrate hand-off station is configured to hold a plurality of substrates.

5. The system according to claim 4, wherein at least one substrate hand-off station is a passive rack defining a plurality of spaced apart substrate holding positions, each of which positions is accessible from substantially opposite sides for insertion and removal of a substrate.

6. The system according to claim 5, wherein said passive rack includes at least two substantially vertically extending members which, at spaced apart positions along their heights, are provided with supports, the supports defining a plurality of substrate holding positions at different vertical levels, each for holding a substantially horizontally oriented substrate.

7. The system according to claim 1, wherein the coupling provision of at least one processing unit includes a gate that is provided in the side wall of the substrate transfer chamber of said at least one processing unit, wherein said gate defines the substrate transfer passage that enables the passage of substrates.

8. The system according to claim 7, wherein the gate is arrangeable between a closed state, in which it closes off the substrate transfer passage, and an open state, in which the substrate transfer passage enables the transfer of substrates.

9. The system according to claims 1, further including at least one control unit that is configured to control operation of the substrate handling robots of the system, and to assign a process route to a substrate entering the system from a substrate cassette docked to one of the substrate cassette I/O-ports.

10. The system according to claim 9, wherein a portion of at least one process route extends from a reactor of a first processing unit to a substrate hand-off station, and from said substrate hand-off station to a reactor of a second processing unit.

11. The system according to claim 1, wherein at least one processing unit, or a reactor module of at least one processing unit, has a generally L-shaped footprint.

12. The system according to claim 1, wherein the at least one substrate cassette I/O-port is a front opening unified pod (FOUP) load port.

13. The system according to claim 1, wherein the reactor of at least one processing unit is a vertical batch furnace.

14. The system according to claim 1, wherein the reactor of at least one processing unit is a single wafer reactor.

15. The system according to claim 1, wherein the reactor module of at least one processing unit comprises at least two reactors.

16. The system according to claim 15, wherein the reactor module of said processing unit comprises at least two reactors and a substrate distribution system configured to distribute substrates between said at least two reactors.

17. The system according to claim 1, wherein the substrate transfer module is an equipment front end module (EFEM).

18. The system according to claim 1, wherein at least one processing unit comprises a pod stocking system, the pod stocking system comprising at least one stocker I/O-port for receiving and outputting pods from and to an external source, a plurality of pod stocking accommodations and a pod transfer robot for transferring a pod between the stocker I/O-port, the plurality of pod stocking accommodations and the substrate cassette I/O port of the substrate transfer chamber of the at least one processing unit.

19. A semiconductor substrate processing unit that is configured to be integratable into the modular semiconductor substrate processing system according to claim 1,
wherein the at least one substrate hand-off station is disposed in the substrate transfer chamber laterally between the substrate handling robot and said coupling provision.

20. A substrate processing method comprising:
providing a modular semiconductor processing system according to claim 1;
docking a substrate cassette holding at least one substrate to the substrate cassette I/O-port of a processing unit of the system; and
transferring said at least one substrate along a process route that extends successively from said docked substrate cassette to the reactor of a first processing unit, from said reactor of the first processing unit to a substrate hand-off station of the at least one substrate hand-off station, and from said substrate hand-off station to the reactor of a second processing unit.

* * * * *